(12) United States Patent
Sung et al.

(10) Patent No.: US 12,255,180 B2
(45) Date of Patent: *Mar. 18, 2025

(54) 3D PACKAGE CONFIGURATION

(71) Applicant: CCS Technology Corporation, Taoyuan (TW)

(72) Inventors: Tung-Po Sung, Taoyuan (TW); Chang-Cheng Lo, Taoyuan (TW)

(73) Assignee: CCS Technology Corporation, Taoyuan (TW)

( * ) Notice: Subject to any disclaimer, the term of this patent is extended or adjusted under 35 U.S.C. 154(b) by 489 days.

This patent is subject to a terminal disclaimer.

(21) Appl. No.: 17/678,204

(22) Filed: Feb. 23, 2022

(65) Prior Publication Data

US 2022/0199583 A1 Jun. 23, 2022

Related U.S. Application Data

(63) Continuation-in-part of application No. 17/158,080, filed on Jan. 26, 2021, now Pat. No. 11,373,983.

(30) Foreign Application Priority Data

Dec. 23, 2020 (TW) .................................. 109145694

(51) Int. Cl.
*H01L 25/065* (2023.01)
*H01L 23/00* (2006.01)
*H01L 23/498* (2006.01)
*H01L 23/538* (2006.01)

(52) U.S. Cl.
CPC .... *H01L 25/0657* (2013.01); *H01L 23/49894* (2013.01); *H01L 23/5383* (2013.01); *H01L 23/5387* (2013.01); *H01L 24/08* (2013.01); *H01L 2224/08225* (2013.01)

(58) Field of Classification Search
None
See application file for complete search history.

(56) References Cited

U.S. PATENT DOCUMENTS

| | | | | |
|---|---|---|---|---|
| 7,875,974 B2* | 1/2011 | Gokan | ................ | H01L 25/0657 257/730 |
| 2012/0261814 A1* | 10/2012 | Slavov | ................ | H01L 25/0657 257/737 |

* cited by examiner

*Primary Examiner* — Long Pham

(57) ABSTRACT

A novel 3D package configuration is provided by stacking a plurality of semiconductor package units or a folded flexible circuit board structure on a package substrate and electrically connected therewith based on the foldable characteristics of the flexible circuit board, and the high temperature resistance of the flexible circuit board which is suitable for insulating layer process, metal layer process, photolithography process, etching and development process, to make conventional semiconductor dies of various functions be bonded on one die and/or two side of a flexible circuit board and electrically connected therewith in advance.

5 Claims, 13 Drawing Sheets

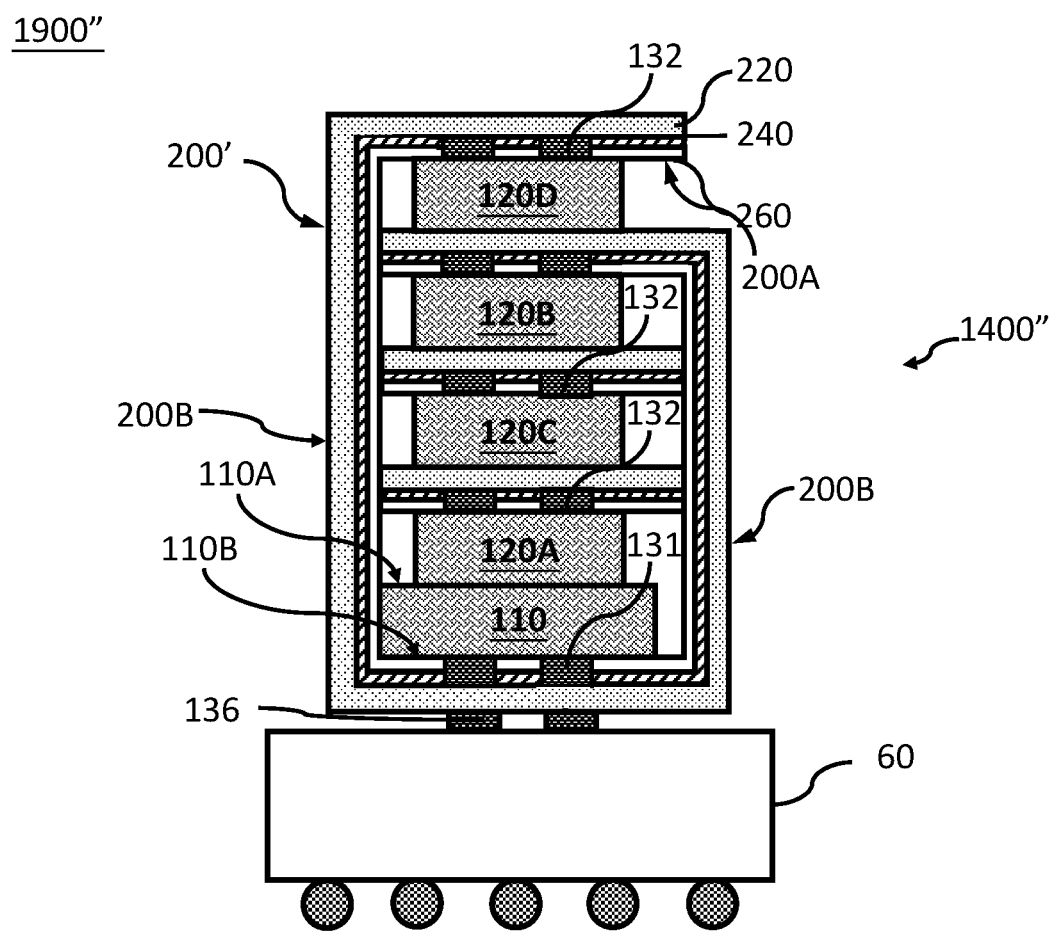
FIG. 1D"

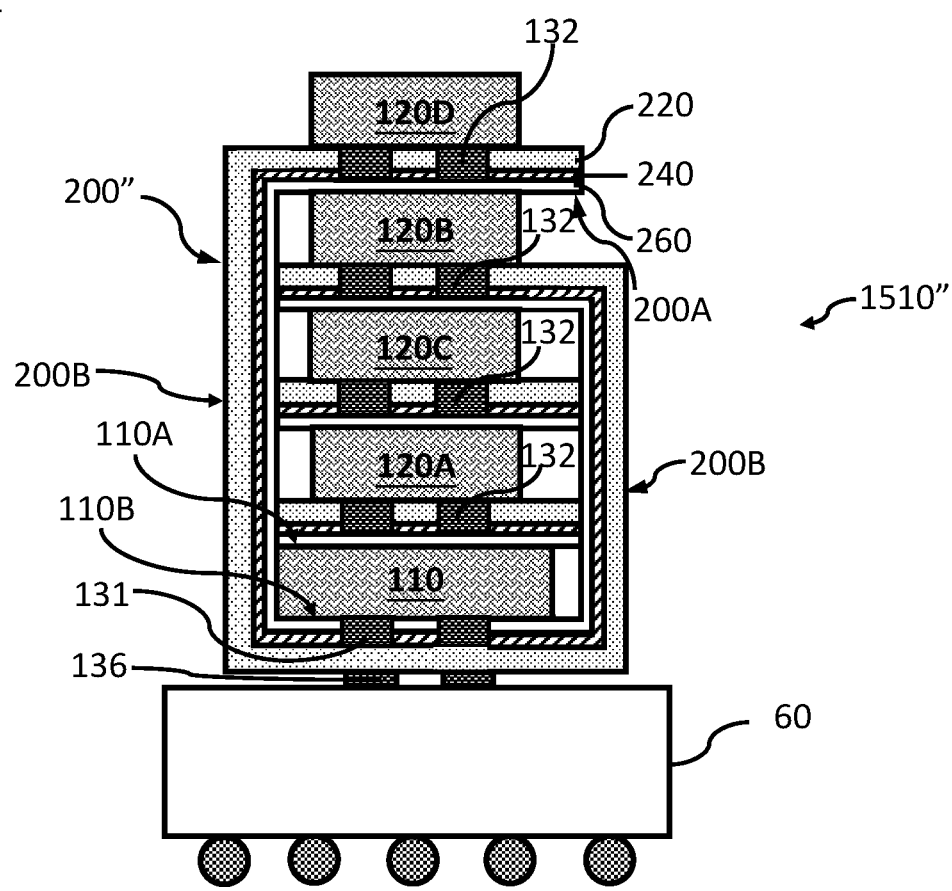
FIG. 2E"

3D PACKAGE CONFIGURATION

CROSS-REFERENCE TO RELATED APPLICATION

This application is a continuation-in-part (CIP) application of, claims priority to and the benefit of, U.S. patent application Ser. No. 17/158,080 filed on Jan. 26, 2021 and entitled "3D PACKAGE CONFIGURATION", which claims the priority benefit of Taiwanese Application Serial Number 109145694, filed on Dec. 23, 2020, which is incorporated herein by reference.

TECHNICAL FILED

This invention relates to a package configuration, and particularly relates to a 3D package configuration.

BACKGROUND OF THE INVENTION

The application of 3D package configurations is rapidly developing to solve important technical issues such as miniaturization, multi-function integration, faster interconnection, and energy saving. A typical 3D package configuration usually obtained by stacking dies with through-silicon vias (TSV) or dies interconnected by micro-bumps and electrically connected to each other by micro-bumps.

However, the above-mentioned 3D package configurations usually involve thin film deposition, photolithography, development, etching, metallization and other semiconductor manufacturing processes, which are not only complicated in process and time-wasting in packaging, but also low yield rate and high cost. In view of these disadvantages, a novel 3D package configuration that can be manufactured by conventional techniques is highly expected by the industry.

SUMMARY OF THE INVENTION

This invention discloses a 3D package configuration, comprising a package substrate; and a folded flexible circuit board structure vertically stacked on the package substrate and electrically connected therewith through package substrate bonding pads thereof, comprising: a folded flexible circuit board formed by folding a cross-shaped flexible circuit board, wherein the cross-shaped flexible circuit board comprises a first surface and a second surface opposite to each other, and the cross-shaped flexible circuit board has a first die bonding zone formed on the first surface and at least one second die bonding zone formed on the first surface or the second surface; at least one first semiconductor die bonded to the first die bonding zone and electrically connected to the cross-shaped flexible circuit board; and at least one second semiconductor die bonded to the at least one second die bonding zone and electrically connected to the cross-shaped flexible circuit board; wherein, the at least one second semiconductor die is vertically stacked above the at least one first semiconductor die.

The above-mentioned 3D package configuration comprises a plurality of second semiconductor dies spaced with each other, and a plurality of second die bonding zones formed on the first surface or the second surface of the cross-shaped flexible circuit board, wherein each of the second semiconductor dies is bonded on each of the second semiconductor die bonding zones and electrically connected to the cross-shaped flexible circuit board through each of the second die bonding pads in each of the second die bonding zones, and the second semiconductor die are vertically and sequentially stacked above the at least one first semiconductor die, and the first die bonding zone overlaps with the second die bonding zones.

The above-mentioned 3D package configuration, wherein the second die bonding zones are concurrently formed on the first surface of the cross-shaped flexible circuit board or concurrently formed on the second surface of the cross-shaped flexible circuit board.

The above-mentioned 3D package configuration, wherein the cross-shaped flexible circuit board comprises: a cross-shaped flexible insulating substrate; a circuit formed on a surface of the cross-shaped flexible insulating substrate; and an cross-shaped insulating layer overlaying the circuit; wherein, the first die bonding zone comprises a plurality of first die bonding pads electrically connected to the circuit to make the first semiconductor die electrically connected to the circuit through the first die bonding pads, and the at least one second die bonding zone comprises a plurality of second die bonding pads electrically connected to the circuit to make the at least one second semiconductor die electrically connected to the circuit through the second die bonding pads, and a plurality of package substrate bonding pads under the first die bonding zone are formed on the second surface of the cross-shaped flexible circuit board, and each of the package substrate bonding pads is electrically connected to each of the first die bonding pads corresponding thereof through a conductive hole.

The above-mentioned 3D package configuration, wherein the material of the cross-shaped flexible insulating substrate is selected from one of the group consisting of Polyester resin, Polyimide (PI), Modified Polyimide (MPI), Covalent Organic Framework (COF), Liquid Photo-Imageable (LPI)、 Liquid Crystal Polymer (LCP), Polytetrafluoroethylene (PTFE) and flexible epoxy bonded fiber-glass board, or combinations thereof.

The above-mentioned 3D package configuration, wherein the material of the circuit is selected from one of the group consisting of copper, copper alloy, tinned copper, tin alloy, aluminum, aluminum alloys, gold and silver, or combinations thereof.

BRIEF DESCRIPTION OF THE DRAWINGS

FIG. 1D' is a cross-sectional view of another 3D package configuration 1900' according to another Embodiment of this invention.

FIG. 1D" is a cross-sectional view of another 3D package configuration 1900" according to another Embodiment of this invention.

DETAILED DESCRIPTION OF THE INVENTION

In the following detailed description, for purposes of explanation, numerous specific details are set forth in order to provide a thorough understanding of the disclosed Embodiment. It will be apparent, however, that one or more Embodiments may be practiced without these specific details.

It is apparent that departures from specific designs and methods described and shown will suggest themselves to those skilled in the art and may be used without departing from the spirit and scope of the invention. The present invention is not restricted to the particular constructions described and illustrated, but should be construed to cohere with all modifications that may fall within the scope of the appended claims.

Embodiment

Figure 1A:
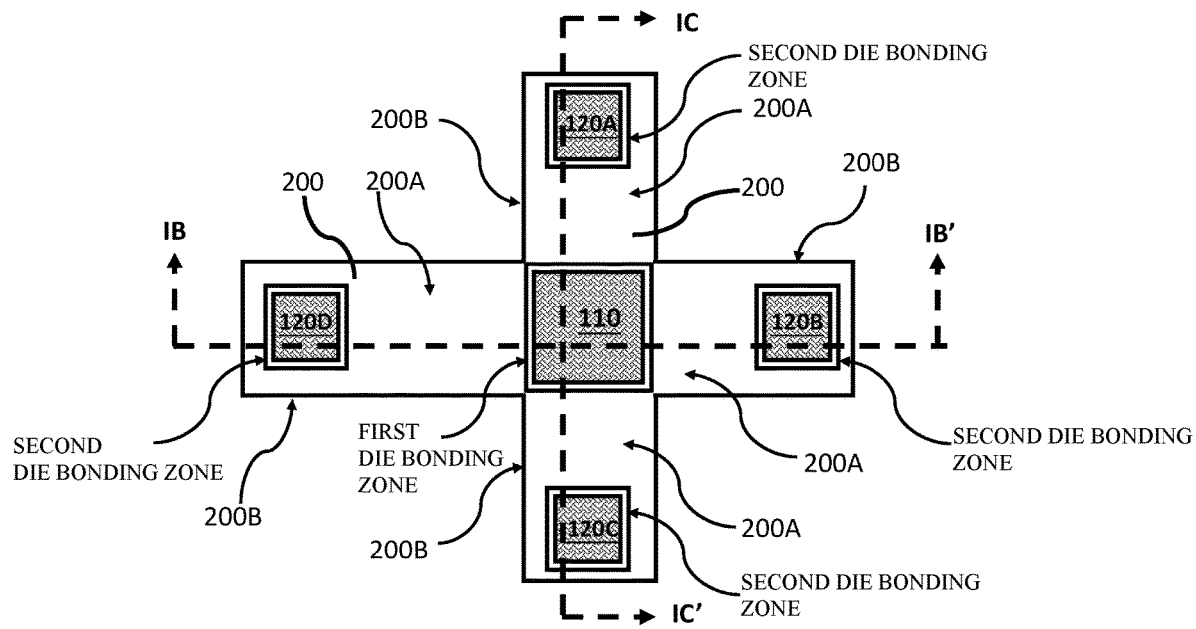
FIG. 1A a top view of a cross-shaped flexible circuit board according to an Embodiment of this invention.
Figure 1B:
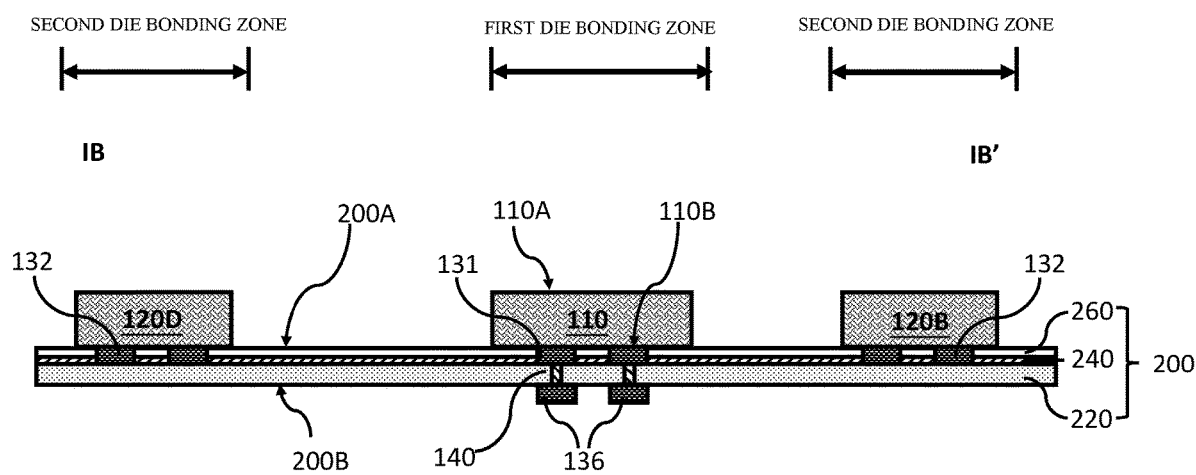
FIG. 1B is a cross-sectional view of the cross-shaped flexible circuit board shown in FIG. 1A along with the cross-sectional line IB-IB' in FIG. 1A.
Figure 1C:
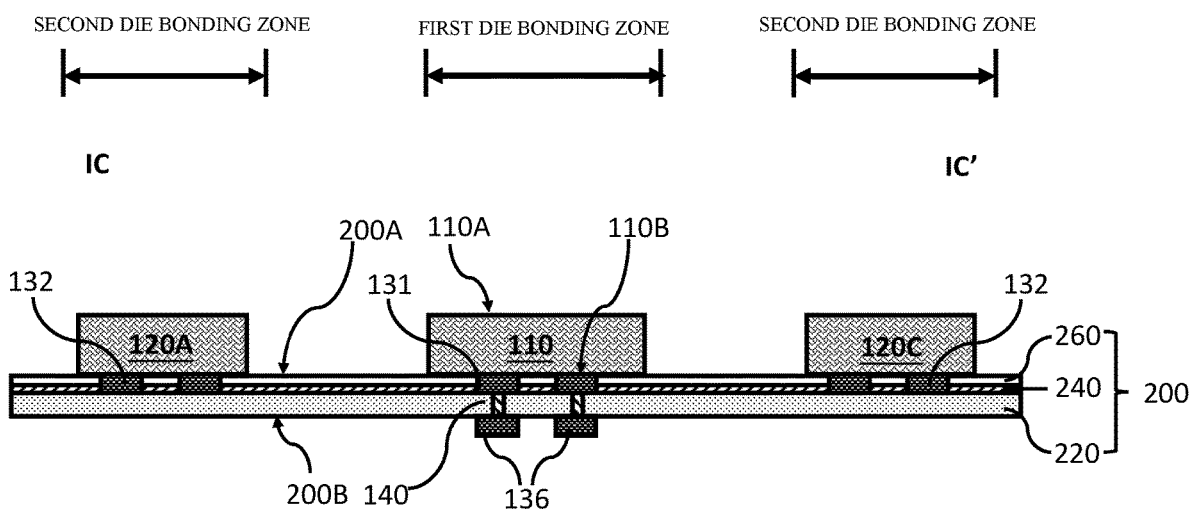
FIG. 1C is a cross-sectional view of the cross-shaped flexible circuit board shown in FIG. 1A along with the cross-sectional line IC-IC'.
Figure 1D:
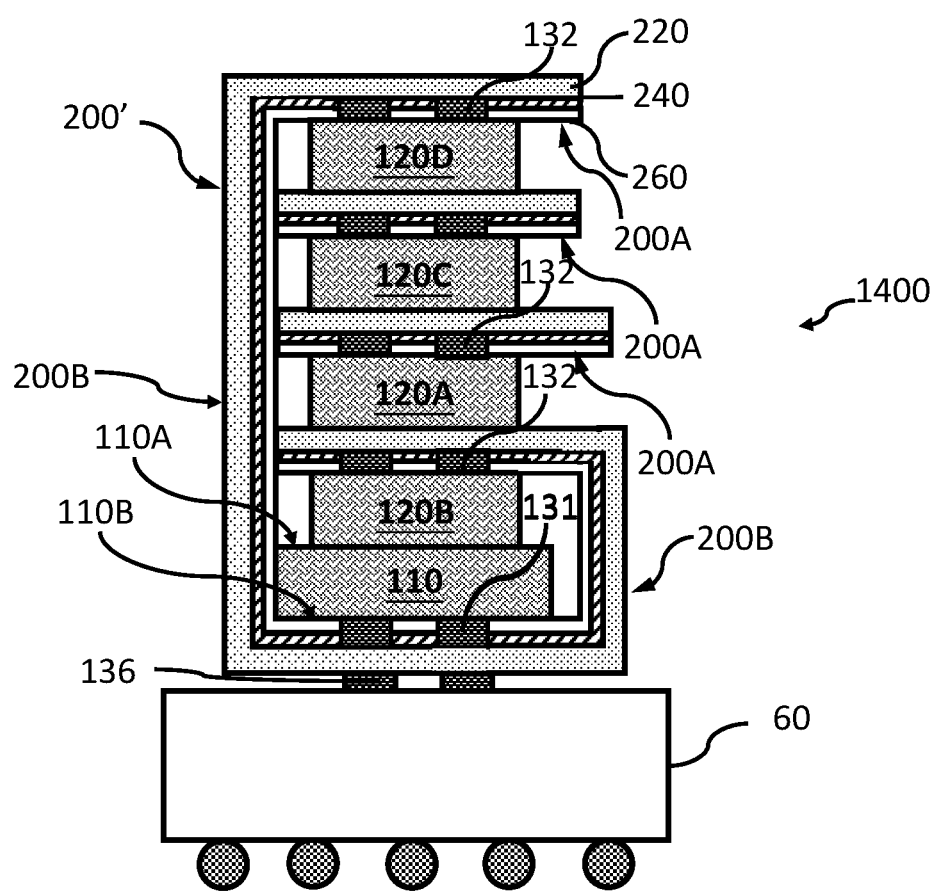
FIG. 1D is a a cross-sectional view of a 3D package configuration 1900 according to an Embodiment of this invention.
Figure 1D:
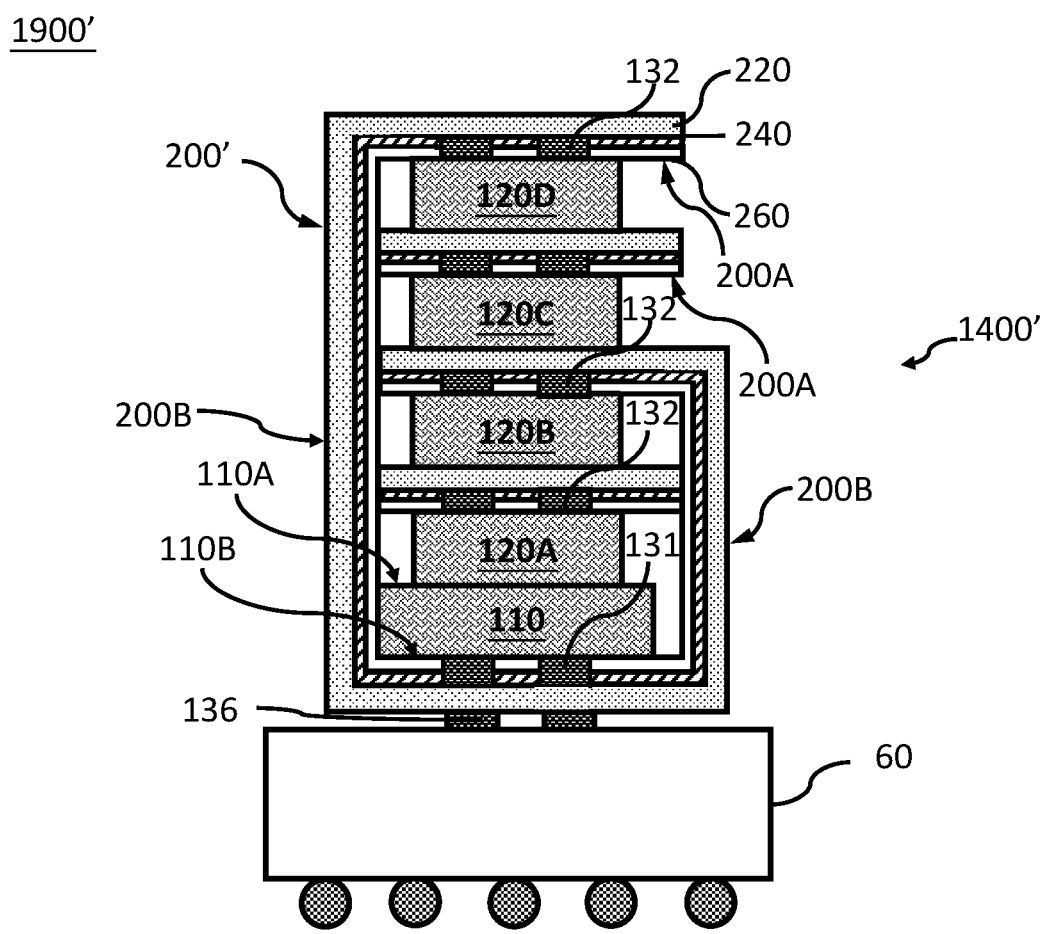

Please refer to FIGS. 1A~1C, and FIGS. 1D, 1D' and 1D". FIG. 1A is a top view of a cross-shaped flexible circuit board according to an Embodiment of this invention. FIG. 1B is a cross-sectional view along with the cross-sectional line IB-IB' shown in FIG. 1A. FIG. 1C is a cross-sectional view along with the cross-sectional line IC-IC' shown in FIG. 1A. FIG. 1D is a cross-sectional view of a 3D package configuration 1900 according to an Embodiment of this present invention. FIG. 1D' is a cross-sectional view of another 3D package configuration 1900' according to an Embodiment of this invention. FIG. 1D" is a cross-sectional view of another 3D package configuration 1900" according to an Embodiment of this invention.

This present Embodiment discloses a 3D package configuration 1900 as shown in FIG. 1D, comprising a package substrate 60 and a folded flexible circuit board structure 1400 vertically stacked on the package substrate 60 and electrically connected therewith. The folded flexible circuit board structure 1400 comprises a folded flexible circuit board 200', a first semiconductor die 110 and a plurality of second semiconductor dies including 120A, 120B, 120C and 120D. The folded flexible circuit board 200' was formed by folding a cross-shaped flexible circuit board 200 as shown in FIGS. 1A~1C comprising a flexible insulating substrate 220, a circuit 240 formed on a surface of the flexible insulating substrate 220 and an insulating layer 260 overlaying the circuit 240, wherein the cross-shaped flexible circuit board 200 has a first surface 200A and a second surface 200B opposite to each other, and the first surface 200A includes a first die bonding zone and a plurality of second die bonding zones formed thereon, and the first die bonding zone includes a plurality of first die bonding pads 131 electrically connected to the circuit 240, and each of the second die bonding zones includes a plurality of second die bonding pads 132 electrically connected to the circuit 240, and the second surface 200B under the first die bonding zone further comprises a plurality of package substrate bonding pads 136, wherein each of the package substrate bonding pads 136 corresponding to each of the first die bonding pads 131 and electrically to each other through a first conductive hole 140. The first semiconductor die 110 was bonded to the first die bonding zone and electrically connected to the circuit 240 through the first die bonding pads 131. The second semiconductor dies including 120A, 120B, 120C and 120D were respectively bonded to each of the second die bonding zones and electrically connected to the circuit 240 through the second die bonding pads 132 therein.

According to this present Embodiment, the package substrate 60 can be for example but not limited to a lead frame, a Ball Grid Array (BGA) package substrate including a ceramic BGA package substrate, a plastic BGA package substrate, a metal BGA package substrate and a tape BGA package substrate, a Chip Scale Package (CSP) substrate or a Flip Chip (FC) package substrate.

The flexible circuit boards 200 of this present Embodiment comprises a first semiconductor die 110 bonded to the first die bonding zone, and a plurality of second semiconductor dies including 120A, 120B, 120C and 120D respectively bonded to each of the second die bonding zones. However, the flexible circuit board 200 according to other Embodiments of this invention can alternatively comprise more than one first semiconductor dies 110 bonded to the first die bonding zone, and one or more second semiconductor dies 120A and/or 120B and/or 120C and/or 120D bonded to each of the second die bonding zones, if necessary.

As shown in FIGS. 1A~1C and 1D, the folded flexible circuit board structure 1400 as shown in FIG. 1D was obtained by folding the cross-shaped flexible circuit board 200 shown in FIGS. 1A~1C in sequence to make the cross-shaped flexible circuit board 200 with the second semiconductor die 120B be bonded thereon be folded above the first semiconductor die 110, and then the cross-shaped flexible circuit board 200 with the second semiconductor die 120A be bonded thereon be folded above the second semiconductor die 120B, and then the cross-shaped flexible circuit board 200 with the second semiconductor die 120C be bonded thereon be folded above the second semiconductor die 120A, and then the cross-shaped flexible circuit board 200 with the second semiconductor die 120D be bonded thereon be folded above the second semiconductor die 120C, wherein the second semiconductor dies 120B, 120A, 120C and 120D were vertically stacked above the first semiconductor die 110 in sequence. The folded flexible circuit board structure 1400 was vertically stacked on the package substrate 60 through the package substrate bonding pads 136 and electrically connected therewith, and then placed into a jig for subsequent package treatment to generate a 3D package configuration 1900 as shown in FIG. 1D.

Alternatively, as shown in FIGS. 1A~1C and 1D', according to another Embodiment of this invention, another folded flexible circuit board structure 1400' comprising a folded flexible circuit board 200', a first semiconductor die 110 and a plurality of second semiconductor dies including 120A, 120B, 120C and 120D as shown in FIG. 1D' was obtained by folding the cross-shaped flexible circuit board 200 as shown in FIGS. 1A~1C in sequence to make the cross-shaped flexible circuit board 200 with the second semiconductor die 120A be bonded thereon be folded above the first semiconductor die 110, and then the cross-shaped flexible circuit board 200 with the second semiconductor die 120B be bonded thereon be folded above the second semiconductor die 120A, and then the cross-shaped flexible circuit board 200 with the second semiconductor die 120C be bonded thereon be folded above the second semiconductor die 120B, and then the cross-shaped flexible circuit board 200 with the second semiconductor die 120D be bonded thereon be folded above the second semiconductor die 120C, wherein the second semiconductor dies 120A, 120B, 120C and 120D were vertically stacked above the first semiconductor die 110 in sequence. The folded flexible circuit board structure 1400' was vertically stacked on the package substrate 60 through the package substrate bonding pads 136 and electrically connected therewith, and then placed into a jig for subsequent package treatment to generate a 3D package configuration 1900' as shown in FIG. 1D'.

Alternatively, as shown in FIGS. 1A~1C and 1D", according to another Embodiment of this invention, another folded flexible circuit board structure 1400" comprising a folded flexible circuit board 200', a first semiconductor die 110 and a plurality of second semiconductor dies including 120A, 120B, 120C and 120D as shown in FIG. 1D" was obtained by folding the cross-shaped flexible circuit board 200 as shown in FIGS. 1A~1C in sequence to make the cross-shaped flexible circuit board 200 with the second semiconductor die 120A be bonded thereon be folded above the first semiconductor die 110, and then the cross-shaped flexible circuit board 200 with the second semiconductor die 120C be bonded thereon be folded above the second semiconductor die 120A, and then the cross-shaped flexible circuit board 200 with the second semiconductor die 120B be bonded thereon be folded above the second semiconductor die 120C, and then the cross-shaped flexible circuit board 200 with the second semiconductor die 120D be bonded thereon be folded above the second semiconductor die 120B, wherein the second semiconductor dies 120A, 120C, 120B and 120D were vertically stacked above the first semiconductor die 110 in sequence. The folded flexible circuit board structure 1400" was vertically stacked on the package substrate 60 through the package substrate bonding pads 136 and electrically connected therewith, and then placed into a jig for subsequent package treatment to generate a 3D package configuration 1900" as shown in FIG. 1D".

The first semiconductor die 110 and the second semiconductor dies 120A, 120B, 120C and 120D of the 3D package configurations 1900, 1900' and 1900" can respectively be for example but not limited to a CPU die, a GPU die, a DSP die, a MPU die, a MCU die, a DRAM die, a SRAM die, a Standard Logic IC die, an ASIC die for a special application, a sensing die with a specific sensing function, or a driving IC die.

The first die bonding pads 131, the second die bonding pads 132 and the package substrate bonding pads 136 of the 3D package configurations 1900, 1900' and 1900" are respectively for example but not limited to solder balls or metallic bumps formed by a material selected from one of the group consisting of tin, tin alloys including tin/copper alloy, tin/ITO alloy, tin/silver alloy, tin/bismuth alloy and tin/lead alloy, and conductive polymers.

The material for the flexible insulating substrate 220 of the 3D package configurations 1900, 1900' and 1900" can be selected from for example but not limited to one of the group consisting of Polyester resin, Polyimide (PI), Modified Polyimide (MPI), Covalent Organic Framework (COF), Liquid Photo-Imageable (LPI), Liquid Crystal Polymer (LCP), Polytetrafluoroethylene (PTFE) and flexible epoxy bonded fiber-glass board, or combinations thereof.

The material for the circuit 240 of the 3D package configurations 1900, 1900' and 1900" is selected from for example but not limited to one of the group consisting of copper, copper alloy, tinned copper, tin alloy, aluminum, aluminum alloys, gold and silver, or combinations thereof.

The above-mentioned 3D package configurations 1900, 1900' and 1900", wherein the circuit 240 of the flexible circuit board 200 can be a single-layered circuit or a multiple-layered circuit, and the insulating layer 260 overlaying the circuit 240 can also be a single-layered insulating layer or a multiple-layered insulating layer.

According to another embodiment of this invention, additional adhesive layers can be coated on the first surface 200A or the second surface 200B of the flexible circuit board 200 of the 3D package configurations 1900, 1900' and 1900" to fasten the folded flexible circuit board structures 1400, 1400' and 1400" vertically stacked on the package substrate 60.

Figure 2A:
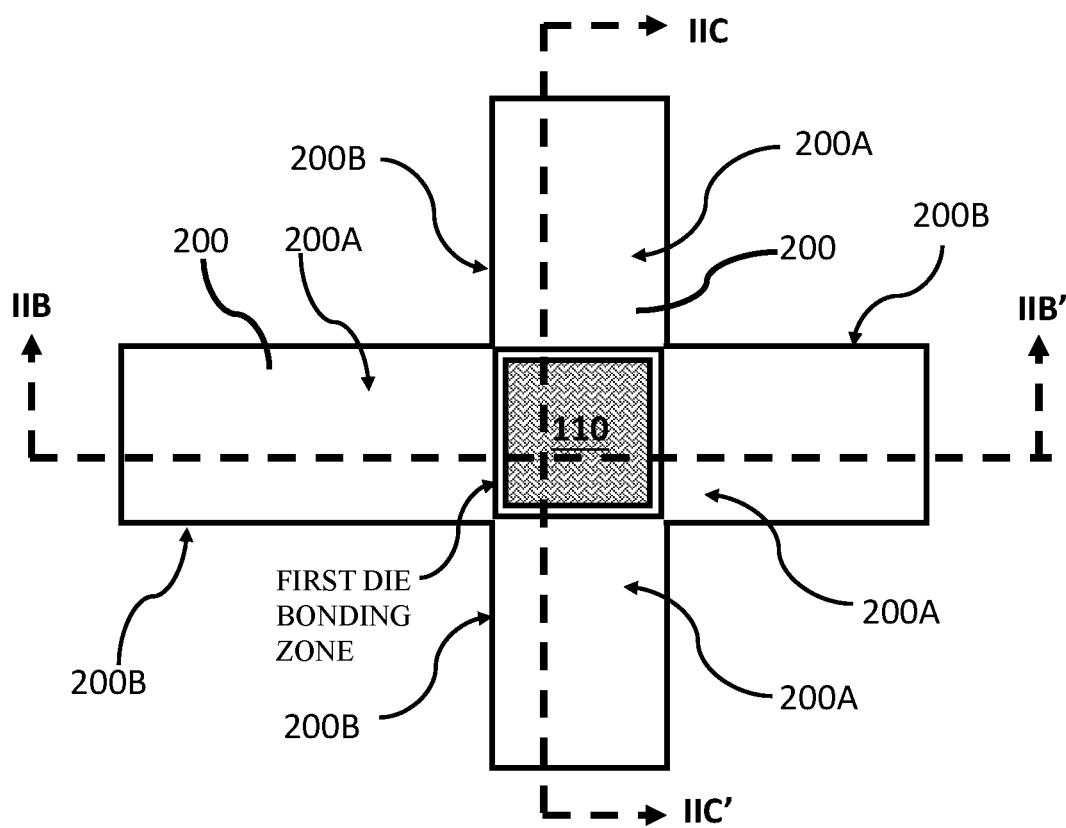
FIG. 2A is a top view of a cross-shaped flexible circuit board according to another Embodiment of this invention.
Figure 2B:
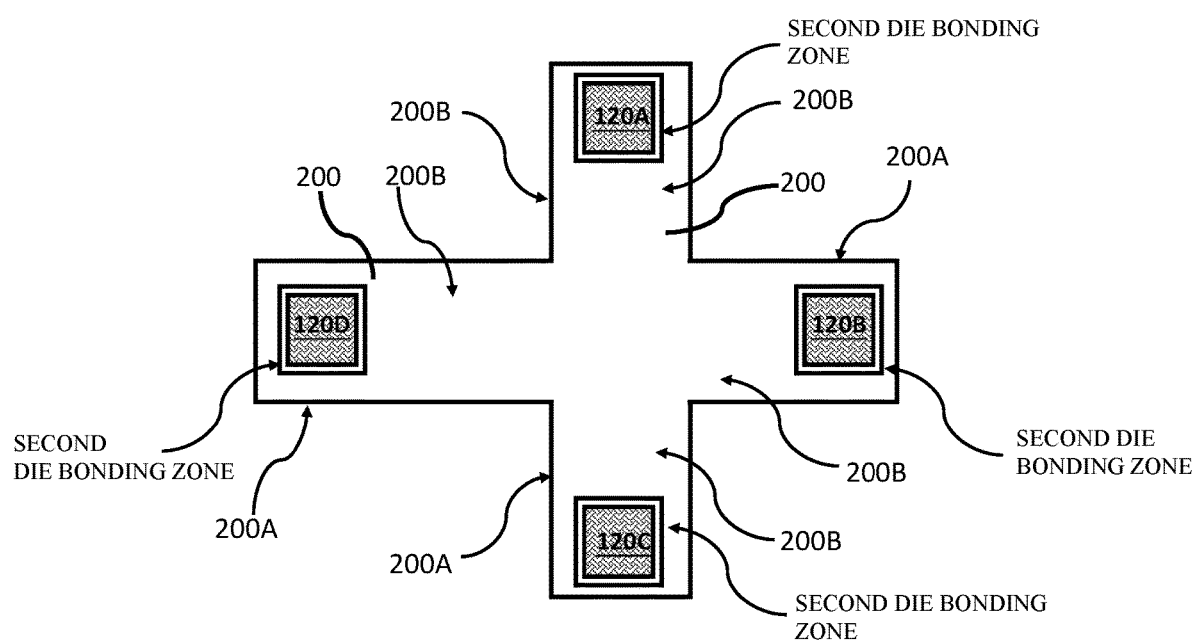
FIG. 2B is a bottom view of a cross-shaped flexible circuit board according to another Embodiment of this invention.
Figure 2C:
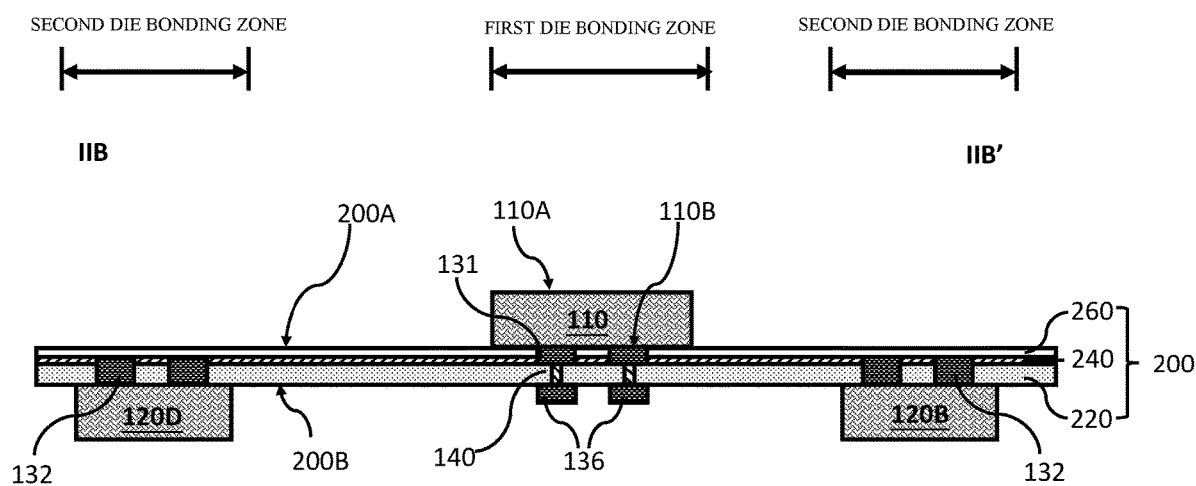
FIG. 2C is a cross-sectional view of the cross-shaped flexible circuit board shown in FIG. 2A along with the cross-sectional line IIB-IIB' in FIG. 2A.
Figure 2D:
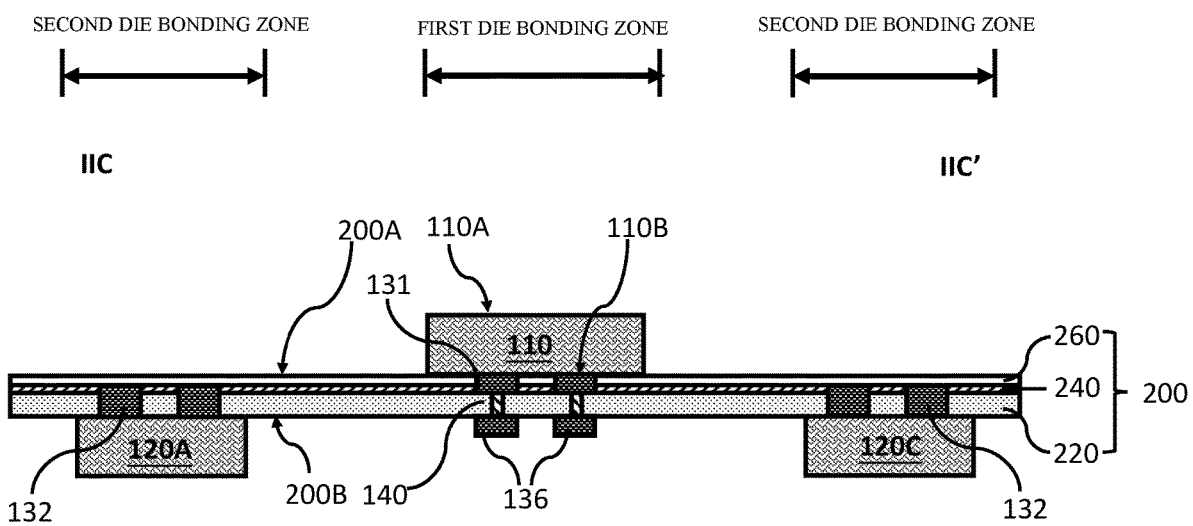
FIG. 2D is a cross-sectional view of the cross-shaped flexible circuit board shown in FIG. 2A along with the cross-sectional line IIC-IIC' in FIG. 2A.
Figure 2E:
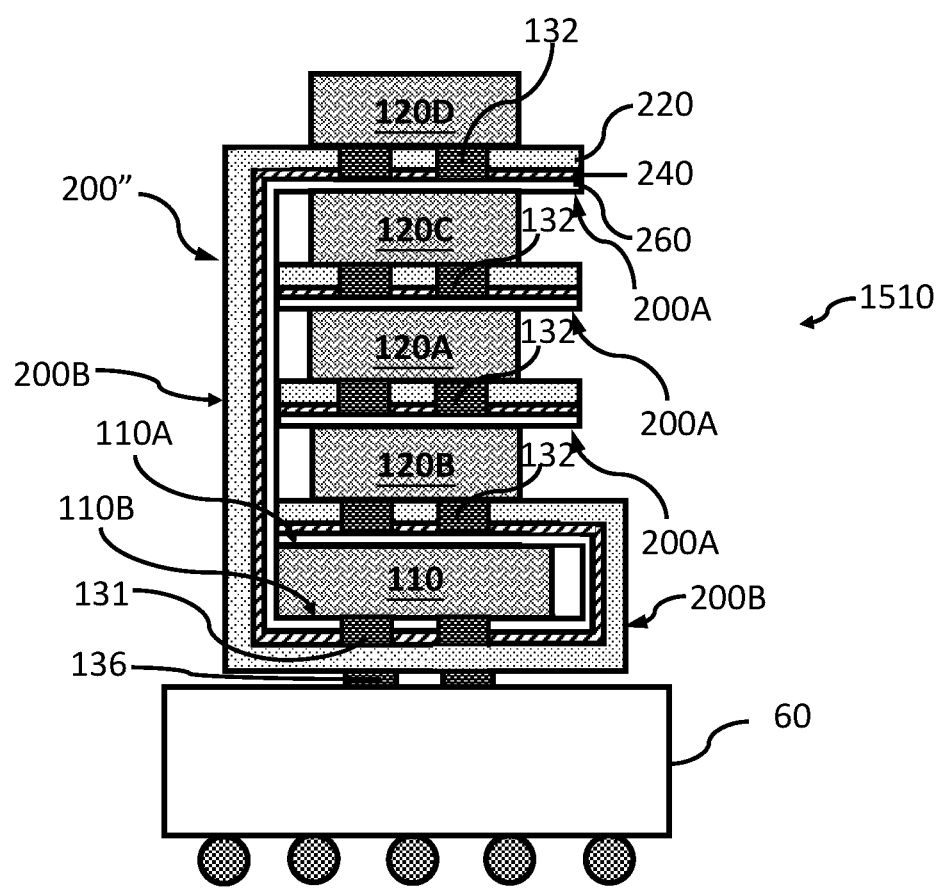
FIG. 2E is a cross-sectional view of another 3D package configuration 2000 according to another Embodiment of this invention.
Figure 2E:
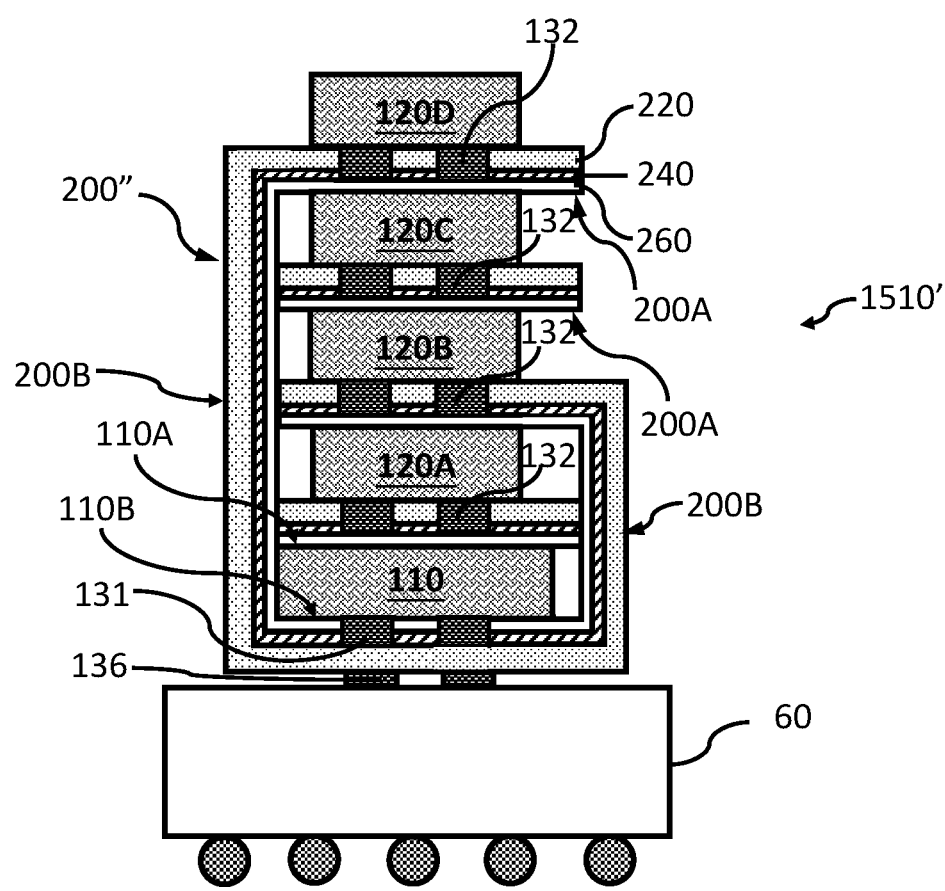

According to other Embodiments of this invention, the second die bonding zones were formed on the second surface of the cross-shaped flexible circuit board 200 as shown in FIGS. 2A~2D, and a first semiconductor die 110 was bonded to the first die bonding zone on the first surface of the cross-shaped flexible circuit board 200, and a plurality of second semiconductor dies including 120A, 120B, 120C and 120D were respectively bonded to each of the second die bonding zones on the second surface of the cross-shaped flexible circuit board 200. FIG. 2A is a top view of a cross-shaped flexible circuit board according to another Embodiment of this invention. FIG. 2B is a bottom view of a cross-shaped flexible circuit board according to another Embodiment of this invention. FIG. 2C is a cross-sectional view of the cross-shaped flexible circuit board shown in FIG. 2A along with the cross-sectional line IIB-IIB' in FIG. 2A. FIG. 2D is a cross-sectional view of the cross-shaped flexible circuit board shown in FIG. 2A along with the cross-sectional line IIC-IIC' in FIG. 2A. Similarly, 3D package configurations 2000, 2000' and 2000" as shown in FIG. 2E, 2E' or 2E" comprising a package substrate 60 and a folded flexible circuit board structure 1510, 1510' or 1510" vertically stacked on the package substrate 60 and electrically connected therewith were obtained. Each of the folded flexible circuit board structures 1510, 1510' and 1510" comprises a folded flexible circuit board 200" obtained by folding the the cross-shaped flexible circuit board 200 shown in FIGS. 2A~2D, a first semiconductor die 110 and a plurality of second semiconductor dies including 120A, 120B, 120C and 120D. Each of the folded flexible circuit board structures 1510, 1510' and 1510" was respectively obtained by folding the cross-shaped flexible circuit board 200 shown in FIGS. 2A~2D as similar methods mentioned above. Besides, the flexible circuit board 200 according to other Embodiments of this invention can alternatively comprise more than one first semiconductor dies 110 bonded to the first die bonding zone, and one or more second semiconductor dies 120A and/or 120B and/or 120C and/or 120D bonded to each of the second die bonding zones, if necessary.

As described in the above Embodiments, a novel 3D package configuration can be obtained by stacking a folded flexible circuit board structure on a package substrate and electrically connected therewith based on the foldable characteristics of the flexible circuit board, and the high temperature resistance of the flexible circuit board which is suitable for insulating layer process, metal layer process, photolithography process, etching and development process, to make conventional semiconductor dies such as CPU dies, GPU dies, DRAM dies, SRAM dies, tel-communication dies, standard logic IC dies, ASIC dies, various sensing IC dies, various driving IC and other semiconductor dies with various functions be bonded on one die and/or two side of a flexible circuit board and electrically connected therewith in advance.

Although particular Embodiments have been shown and described, it should be understood that the above discussion is not intended to limit the present invention to these Embodiments. Persons skilled in the art will understand that various changes and modifications may be made without departing from the scope of the present invention as literally and equivalently covered by the following claims.

What is claimed is:

1. A 3D package configuration, comprising:
   a package substrate; and
   a folded flexible circuit board structure vertically stacked on the package substrate and electrically connected therewith through package substrate bonding pads thereof, comprising:
      a folded flexible circuit board formed by folding a cross-shaped flexible circuit board, wherein the cross-shaped flexible circuit board comprises a first surface and a second surface opposite to each other, and the cross-shaped flexible circuit board has a first die bonding zone formed on the first surface and at least one second die bonding zone formed on the first surface or the second surface;
      at least one first semiconductor die bonded to the first die bonding zone and electrically connected to the cross-shaped flexible circuit board; and
      at least one second semiconductor die bonded to the at least one second die bonding zone and electrically connected to the cross-shaped flexible circuit board;
   wherein the cross-shaped flexible circuit board comprises:
      a cross-shaped flexible insulating substrate;
      a circuit formed on a surface of the cross-shaped flexible insulating substrate; and
      an cross-shaped insulating layer overlaying the circuit;
   wherein, the first die bonding zone comprises a plurality of first die bonding pads electrically connected to the circuit to make the first semiconductor die electrically connected to the circuit through the first die bonding pads, and the at least one second die bonding zone comprises a plurality of second die bonding pads electrically connected to the circuit to make the at least one second semiconductor die electrically connected to the circuit through the second die bonding pads, and a plurality of package substrate bonding pads under the first die bonding zone are formed on the second surface of the cross-shaped flexible circuit board, and each of the package substrate bonding pads is electrically connected to each of the first die bonding pads corresponding thereof through a conductive hole;
   wherein, the at least one second semiconductor die is vertically stacked above the at least one first semiconductor die.

2. The 3D package configuration as claimed in claim 1, comprising a plurality of second semiconductor dies spaced with each other, and a plurality of second die bonding zones formed on the first surface or the second surface of the cross-shaped flexible circuit board, wherein each of the second semiconductor dies is bonded on each of the second semiconductor die bonding zones and electrically connected to the cross-shaped flexible circuit board through each of the second die bonding pads in each of the second die bonding zones, and the second semiconductor dies are vertically and sequentially stacked above the at least one first semiconductor die, and the first die bonding zone overlaps with the second die bonding zones.

3. The 3D package configuration as claimed in claim 2, wherein the second die bonding zones are concurrently formed on the first surface of the cross-shaped flexible circuit board or concurrently formed on the second surface of the cross-shaped flexible circuit board.

4. The 3D package configuration as claimed in claim 1, wherein the material of the cross-shaped flexible insulating substrate is selected from one of the group consisting of Polyester resin, Polyimide (PI), Modified Polyimide (MPI), Covalent Organic Framework (COF), Liquid Photo-Imageable (LPI)、Liquid Crystal Polymer (LCP), Polytetrafluoroethylene (PTFE) and flexible epoxy bonded fiber-glass board, or combinations thereof.

5. The 3D package configuration as claimed in claim 1, wherein the material of the circuit is selected from one of the group consisting of copper, copper alloy, tinned copper, tin alloy, aluminum, aluminum alloys, gold and silver, or combinations thereof.

* * * * *